(12) United States Patent
Harumoto et al.

(10) Patent No.: US 11,243,469 B2
(45) Date of Patent: Feb. 8, 2022

(54) SUBSTRATE PROCESSING APPARATUS AND SUBSTRATE PROCESSING METHOD

(71) Applicant: SCREEN HOLDINGS CO., LTD., Kyoto (JP)

(72) Inventors: Masahiko Harumoto, Kyoto (JP); Koji Kaneyama, Kyoto (JP); Yuji Tanaka, Kyoto (JP); Masaya Asai, Kyoto (JP)

(73) Assignee: SCREEN Holdings Co., Ltd.

( * ) Notice: Subject to any disclaimer, the term of this patent is extended or adjusted under 35 U.S.C. 154(b) by 255 days.

(21) Appl. No.: 16/328,804

(22) PCT Filed: Apr. 3, 2017

(86) PCT No.: PCT/JP2017/013879
§ 371 (c)(1),
(2) Date: Feb. 27, 2019

(87) PCT Pub. No.: WO2018/051563
PCT Pub. Date: Mar. 22, 2018

(65) Prior Publication Data
US 2019/0196335 A1     Jun. 27, 2019

(30) Foreign Application Priority Data
Sep. 15, 2016  (JP) .............................. JP2016-180855

(51) Int. Cl.
*G03F 7/40* (2006.01)
*G03F 7/32* (2006.01)
(Continued)

(52) U.S. Cl.
CPC ................. *G03F 7/40* (2013.01); *G03F 7/32* (2013.01); *H01L 21/027* (2013.01);
(Continued)

(58) Field of Classification Search
None
See application file for complete search history.

(56) References Cited

U.S. PATENT DOCUMENTS 5,468,576 A   11/1995   Shibata et al. .................... 430/5
5,543,252 A    8/1996   Shibata et al. .................... 430/5
(Continued)

FOREIGN PATENT DOCUMENTS

JP        06-196397 A     7/1994
JP        2000-182918 A   6/2000
(Continued)

*Primary Examiner* — Kathleen Duda
(74) *Attorney, Agent, or Firm* — Ostrolenk Faber LLP

(57) ABSTRACT

A substrate processing apparatus includes a development processor and a reversal film former, and processes a substrate having one surface on which a resist film made of a photosensitive material is formed. The development processor forms a resist pattern on the one surface of the substrate by performing development processing on a resist film using a development liquid. A reversal film former forms a reversal film having etch resistance higher than that of the resist film on the one surface of the substrate to cover the resist pattern while regulating a temperature of the substrate in a certain range after the development processing is performed by the development processor.

7 Claims, 10 Drawing Sheets

(51) Int. Cl.
    *H01L 21/027*    (2006.01)
    *H01L 21/687*    (2006.01)
    *H01L 21/67*     (2006.01)
(52) U.S. Cl.
    CPC .. *H01L 21/67028* (2013.01); *H01L 21/67051* (2013.01); *H01L 21/68764* (2013.01)

(56)  References Cited

U.S. PATENT DOCUMENTS

| | | | |
|---|---|---|---|
| 2002/0179283 A1 | 12/2002 | Suenaga et al. | 165/58 |
| 2007/0009839 A1 | 1/2007 | Harumoto | 430/313 |
| 2009/0081595 A1* | 3/2009 | Hatakeyama | G03F 7/2041 |
| | | | 430/323 |
| 2012/0045899 A1 | 2/2012 | Maruyama et al. | 438/694 |
| 2013/0330928 A1 | 12/2013 | Ishikawa et al. | 438/694 |
| 2014/0017896 A1 | 1/2014 | Sakaida et al. | 438/694 |

FOREIGN PATENT DOCUMENTS

| | | |
|---|---|---|
| JP | 2003-178946 A | 6/2003 |
| JP | 2004-342973 A | 12/2004 |
| JP | 2010-020109 A | 1/2010 |
| JP | 2010-034214 A | 2/2010 |
| JP | 2011-171708 A | 9/2011 |
| JP | 2013-077843 A | 4/2013 |
| JP | 2015-023172 A | 2/2015 |
| TW | 201133600 A1 | 10/2011 |
| WO | WO 2012/132686 A1 | 10/2012 |

* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2017/013879, filed Apr. 3, 2017, which claims priority to Japanese Patent Application No. 2016-180855, filed Sep. 15, 2016, the contents of both of which are incorporated herein by reference. The PCT International Application was published in the Japanese language.

TECHNICAL FIELD

The present invention relates to a substrate processing apparatus and a substrate processing method of performing processing on a substrate.

BACKGROUND ART

Substrate processing apparatuses are used to subject various substrates such as semiconductor substrates, substrates for liquid crystal display devices, plasma displays, optical discs, magnetic discs, magneto-optical discs, photomasks and other substrates to various types of processing.

In photolithography processing, exposure processing and development processing are performed on a resist film made of a photosensitive material, so that a resist pattern is formed. In recent years, because of finer patterns, collapse of a resist pattern (pattern collapse), deformation of a resist pattern caused by etching, and the like have become a problem. As such, it has been suggested that a reversal pattern of the resist pattern is formed after formation of the resist pattern, and the reversal pattern is used as an etching mask (see Patent Document 1, for example).
[Patent Document 1] JP 5773176 B2

SUMMARY OF INVENTION

Technical Problem

Specifically, after the resist pattern is formed, the reversal film is formed to cover the resist pattern. Subsequently, a reversal film is etched such that the resist pattern is exposed. Thereafter, the resist pattern is removed by etching, so that a reversal pattern having grooves corresponding to the resist pattern is obtained. However, when the film thickness of the reversal film is non-uniform, part of the resist pattern may not be exposed after the reversal film is etched. Thus, the grooves of the formed reversal pattern may not correspond to the resist pattern, and a desired reversal pattern may not be obtained appropriately.

An object of the present invention is to provide a substrate processing apparatus and a substrate processing method that enable a desired reversal pattern to be formed appropriately on a substrate.

Solution to Problem (1) A substrate processing apparatus that processes a substrate having a resist film made of a photosensitive material on one surface includes a development processor that forms a resist pattern on the one surface of the substrate by performing development processing on the resist film using a development liquid, and a reversal film former that forms a reversal film having etch resistance higher than that of the resist film on the one surface of the substrate to cover the resist pattern while regulating a temperature of the substrate in a certain range after the development processing is performed by the development processor.

In this substrate processing apparatus, the reversal film having etch resistance higher than that of the resist film is formed on the one surface of the substrate to cover the resist pattern formed by the development processing. When the reversal film is formed, the temperature of the substrate is regulated in the certain range. Thus, the film thickness of the reversal film can be uniform. In this case, the resist pattern can be exposed appropriately and removed appropriately by etching the reversal film. Thus, a reversal pattern having grooves corresponding to the resist pattern can be formed appropriately. Therefore, a desired reversal pattern can be formed appropriately on the substrate.

(2) The reversal film former may include a rinse liquid temperature regulator that regulates a temperature of a rinse liquid in the certain range, a rinse liquid supplier that supplies the rinse liquid, the temperature of which has been regulated by the rinse liquid temperature regulator, to the substrate, and a processing liquid supplier that supplies a processing liquid made of a material of the reversal film to the one surface of the substrate after the rinse liquid is supplied by the rinse liquid supplier.

In this case, the temperature of the substrate is regulated in the certain range by the rinse liquid. The processing liquid is supplied to the substrate in that state, so that variations in temperature of the processing liquid is prevented from being generated on the substrate. Thus, the reversal film having a uniform thickness can be formed. Therefore, the desired reversal film can be formed appropriately on the substrate.

(3) The rinse liquid supplier may include a first rinse nozzle that discharges the rinse liquid to the one surface of the substrate.

In this case, development residues can be washed away from the one surface of the substrate by the rinse liquid discharged from the first rinse nozzle, and the temperature of the substrate can be regulated in the certain range.

(4) The substrate processing apparatus may further include a rotation holder that holds and rotates the substrate, wherein the processing liquid supplier may supply the processing liquid to the one surface of the substrate with the rinse liquid that has been supplied by the first rinse nozzle remaining on the one surface and the substrate rotated by the rotation holder.

In this case, the processing liquid that has been supplied to the substrate spreads on the one surface of the substrate by a centrifugal force, whereby the rinse liquid remaining on the one surface of the substrate is replaced with the processing liquid. Therefore, the reversal film can be formed on the one surface of the substrate while collapse of the resist pattern caused by surface tension of the rinse liquid is prevented. Further, the processing liquid is supplied with the one surface of the substrate wet with the rinse liquid, whereby the processing liquid spreads easily on the one surface of the substrate. Thus, the amount of the processing liquid to be used can be reduced.

(5) The rinse liquid supplier may include a second rinse nozzle that discharges the rinse liquid to another surface that is opposite to the one surface of the substrate.

In this case, development residues can be prevented from adhering to the other surface of the substrate by the rinse liquid discharged from the second rinse nozzle, and the temperature of the substrate can be regulated in the certain range.

(6) The reversal film former may further include a processing liquid temperature regulator that regulates a temperature of the processing liquid in the certain range, and the processing liquid supplier may supply the processing liquid, a temperature of which has been regulated by the processing liquid temperature regulator, to the one surface of the substrate.

In this case, with the temperature of the substrate kept in the certain range by the rinse liquid, the processing liquid, the temperature of which is in the same range, is supplied to the substrate. Thus, variations in temperature of the processing liquid on the substrate is reduced.

(7) The reversal film former may include a processing liquid temperature regulator that regulates a temperature of a processing liquid made of a material of the reversal film in the certain range, and a processing liquid supplier that supplies the processing liquid, the temperature of which has been regulated by the processing liquid temperature regulator, to the one surface of the substrate with the development liquid that has been supplied by the development processor remaining on the one surface of the substrate.

In this case, the development liquid on the substrate is replaced with the processing liquid. Thus, the development processing of the substrate is stopped, and the temperature of the substrate is regulated in the certain range. Thus, variations in temperature of the processing liquid on the substrate is prevented from being generated. Thus, the reversal film having a uniform thickness can be formed. Therefore, the desired reversal pattern can be formed appropriately on the substrate.

(8) A substrate processing method of processing a substrate having a resist film made of a photosensitive material on one surface, including forming a resist pattern on the one surface of the substrate by performing development processing on the resist film, and forming a reversal film having etch resistance higher than that of the resist film on the one surface of the substrate to cover the resist pattern while regulating a temperature of the substrate in a certain range after the development processing is performed by the development processor.

With this substrate processing method, the reversal film having a uniform thickness can be formed on the substrate. Thus, the reversal pattern having grooves corresponding to the resist pattern can be formed appropriately. Therefore, the desired reversal pattern can be formed appropriately on the substrate.

Advantageous Effects of Invention

The present invention enables a desired reversal pattern to be formed appropriately on a substrate.

DESCRIPTION OF EMBODIMENTS

A substrate processing apparatus and a substrate processing method according to embodiments of the present invention will be described below with reference to drawings. In the following description, a substrate refers to a semiconductor substrate, a substrate for a liquid crystal display device, a substrate for a plasma display, a glass substrate for a photomask, a substrate for an optical disc, a substrate for a magnetic disc, a substrate for a magneto-optical disc, a substrate for a photomask and the like.

(1) Substrate Processing Apparatus

Figure 1:
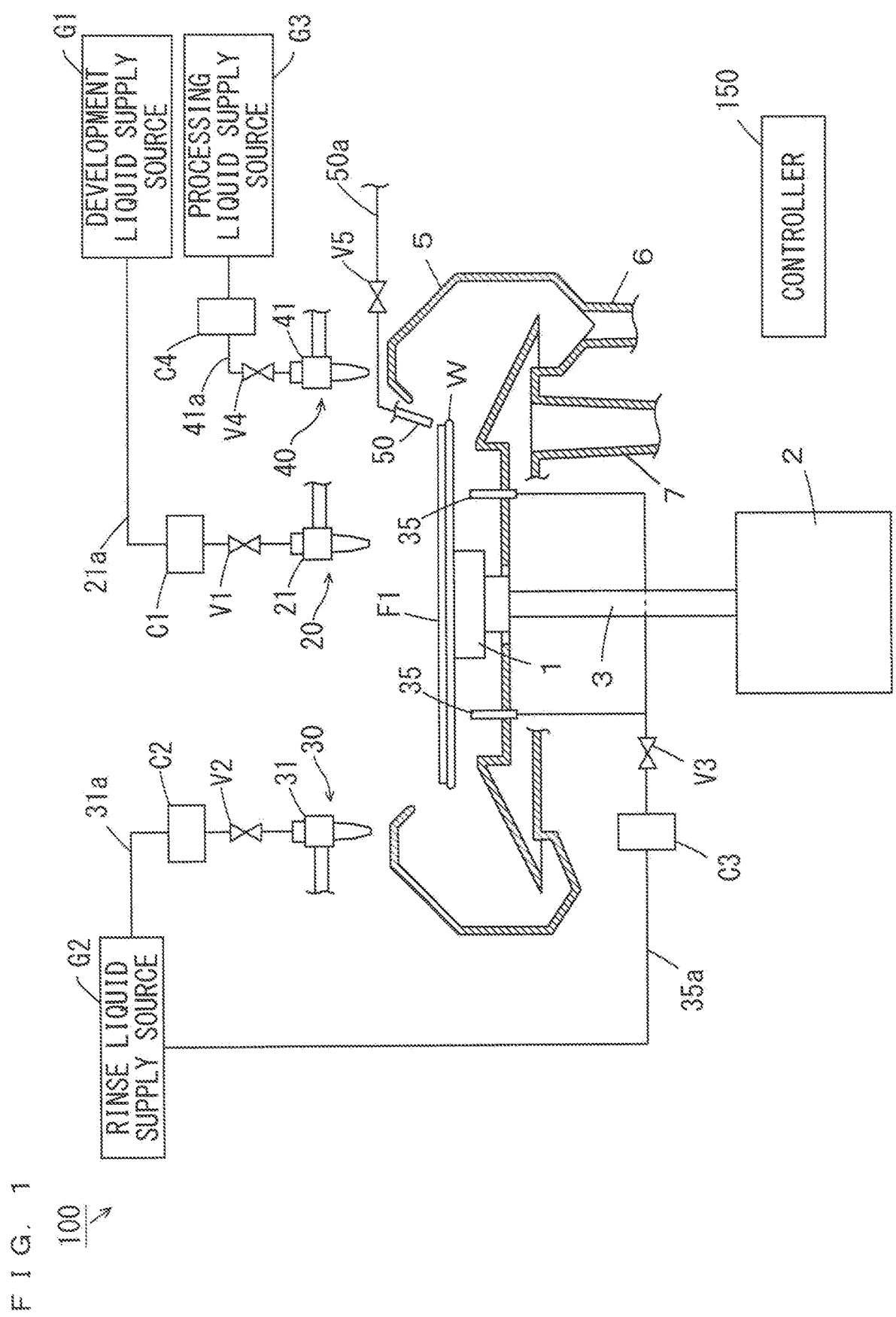
FIG. 1 is a schematic cross sectional view showing a configuration of a substrate processing apparatus according to one embodiment of the present invention.

FIG. 1 is a schematic cross sectional view showing a configuration of a substrate processing apparatus according to one embodiment of the present invention. A substrate W having a resist film F1 made of a photosensitive material is carried into the substrate processing apparatus 100 of FIG. 1. Exposure processing and Post Exposure Bake (PEB) are performed on the resist film F1. Therefore, an exposure pattern made of exposed regions and unexposed regions is formed on the resist film F1.

As shown in FIG. 1, the substrate processing apparatus 100 includes a spin chuck 1, a cup 5, a development liquid supplier 20, a rinse liquid supplier 30, a processing liquid supplier 40, an edge rinse nozzle 50 and a controller 150.

The spin chuck 1 holds the carried-in substrate W in a horizontal attitude. In this case, one surface of the substrate W having the resist film F1 is directed upward. The spin chuck 1 is attached to a tip of a rotation shaft 3 of a motor 2. The motor 2 rotates the spin chuck 1 about a vertical axis. Thus, the substrate W held by the spin chuck 1 is rotated about the vertical axis. The cup 5 is provided to surround the substrate W held by the spin chuck 1 and receives liquid and the like splashed from the rotating substrate W. A liquid drainage pipe 6 for draining liquid and a gas exhaust pipe 7 for exhausting gas are connected to a bottom portion of the cup 5.

The development liquid supplier 20 includes a development nozzle 21, a supply pipe 21a and a nozzle driver 22 (FIG. 3), described below. The development nozzle 21 is connected to a development liquid supply source G1 via the supply pipe 21a. A temperature regulator C1 and a valve V1 are provided at the supply pipe 21a. The temperature regulator C1 regulates the temperature of a development liquid supplied from the development liquid supply source G1. The valve V1 is provided at a further downstream position than the temperature regulator C1. When the valve V1 is opened, the development liquid, the temperature of which has been regulated by the temperature regulator C1, is led to the development nozzle 21, and then the development liquid is discharged from the development nozzle 21.

As a development liquid for positive tone development processing, an alkaline aqueous solution can be used. The alkaline aqueous solution includes TMAH (tetra methyl ammonium hydroxide) or KOH (potassium hydroxide), for example. On the other hand, as a development liquid for negative tone development processing, an organic solvent such as butyl acetate can be used.

The rinse liquid supplier 30 includes a rinse nozzle 31, a plurality of back rinse nozzles 35, supply pipes 31a, 35a and a nozzle driver 32 (FIG. 3), described below. The rinse nozzle 31 is connected to a rinse liquid supply source G2 via the supply pipe 31a. A rinse liquid is pure water or a surfactant, for example. A temperature regulator C2 and a valve V2 are provided at the supply pipe 31a. The temperature regulator C2 regulates the temperature of the rinse liquid supplied from the rinse liquid supply source G2. The valve V2 is provided at a further downstream position than the temperature regulator C2. When the valve V2 is opened, the rinse liquid, the temperature of which has been regulated by the temperature regulator C2, is led to the rinse nozzle 31, and the rinse liquid is discharged from the rinse nozzle 31.

The plurality of back rinse nozzles 35 are respectively positioned below the substrate W held by the spin chuck 1 and connected to the rinse liquid supply source G2 via the supply pipe 35a. A temperature regulator C3 and a valve V3 are provided at the supply pipe 35a. The temperature regulator C3 regulates the temperature of the rinse liquid supplied from the rinse liquid supply source G2. The valve V3 is provided at a further downstream position than the temperature regulator C3. When the valve v3 is opened, the rinse liquid, the temperature of which has been regulated by the temperature regulator C3, is led to the plurality of back rinse nozzles 35, and the rinse liquid is discharged to a lower surface of the substrate W from the plurality of back rinse nozzles 35. The number of back rinse nozzles 35 can be set to any number, and only one back rinse nozzle 35 may be provided, for example.

The processing liquid supplier 40 includes a processing nozzle 41, a supply pipe 41a and a nozzle driver 42 (FIG. 3), described below. The processing nozzle 41 is connected to a processing liquid supply source G3 via the supply pipe 41a. The processing liquid is made of a material having etch resistance higher than that of the material (the photosensitive material) of the resist film F1 and made of resin containing silicon or metal, for example. In this case, the metal is zirconium, hafnium, titanium, tin or tungsten, for example, and the resin is a polysilazane resin, a polystyrene resin, an acrylic resin or an acetal resin, for example.

A temperature regulator C4 and a valve V4 are provided at the supply pipe 41a. The temperature regulator C4 regulates the temperature of the processing liquid supplied from the processing liquid supply source G3. The valve V4 is provided at a further downstream position than the temperature regulator C4. When the valve V4 is opened, the processing liquid, the temperature of which has been regulated by the temperature regulator C4, is led to the processing nozzle 41, and the processing liquid is discharged from the processing nozzle 41.

In the present example, the valves V1, V2, V3, V4 are respectively provided at further downstream positions than the temperature regulators C1, C2, C3, C4. However, if the temperatures of the development liquid, the rinse liquid and the processing liquid to be supplied to the substrate W can be regulated, the valves V1, V2, V3, V4 may be respectively provided at further upstream positions than the temperature regulators C1, C2, C3, C4.

The edge rinse nozzle 50 is arranged to be directed to a peripheral portion of the substrate W held by the spin chuck 1. The edge rinse nozzle 50 is connected to an edge rinse liquid supply source (not shown) via a supply pipe 50a. A valve V5 is provided at the supply pipe 50a. When the valve V5 is opened, an edge rinse liquid is led to the edge rinse nozzle 50 through the supply pipe 50a from the edge rinse supply source, and the edge rinse liquid is discharged to the peripheral portion of the substrate W from the edge rinse nozzle 50. The liquid that can dissolve a reversal material is used as the edge rinse liquid. For example, pure water or an organic solvent such as isopropyl alcohol is used. Further, an alkaline aqueous solution that is used as the development liquid for the positive tone development processing may be used as the edge rinse liquid. Further, a plurality of types of edge rinse liquids may be combined to be used.

The controller 150 includes a CPU (Central Processing Unit), a ROM (Read On Memory), a RAM (Random Access Memory), etc. A control program is stored in the ROM. The CPU controls an operation of each component of the substrate processing apparatus 100 by executing the control program stored in the ROM using the RAM.

(2) Temperature Regulators

The temperature regulators C2, C3, C4 of FIG. 1 regulate the temperatures of the rinse liquid and the processing liquid in a certain range (hereinafter referred to as a target temperature range). For example, the target temperature range is set to include the temperature of an atmosphere in the substrate processing apparatus 100. Specifically, when the temperature of the atmosphere is 23 degrees, for example, the target temperature range is set to range from 22 to 24 degrees.

Figure 2:
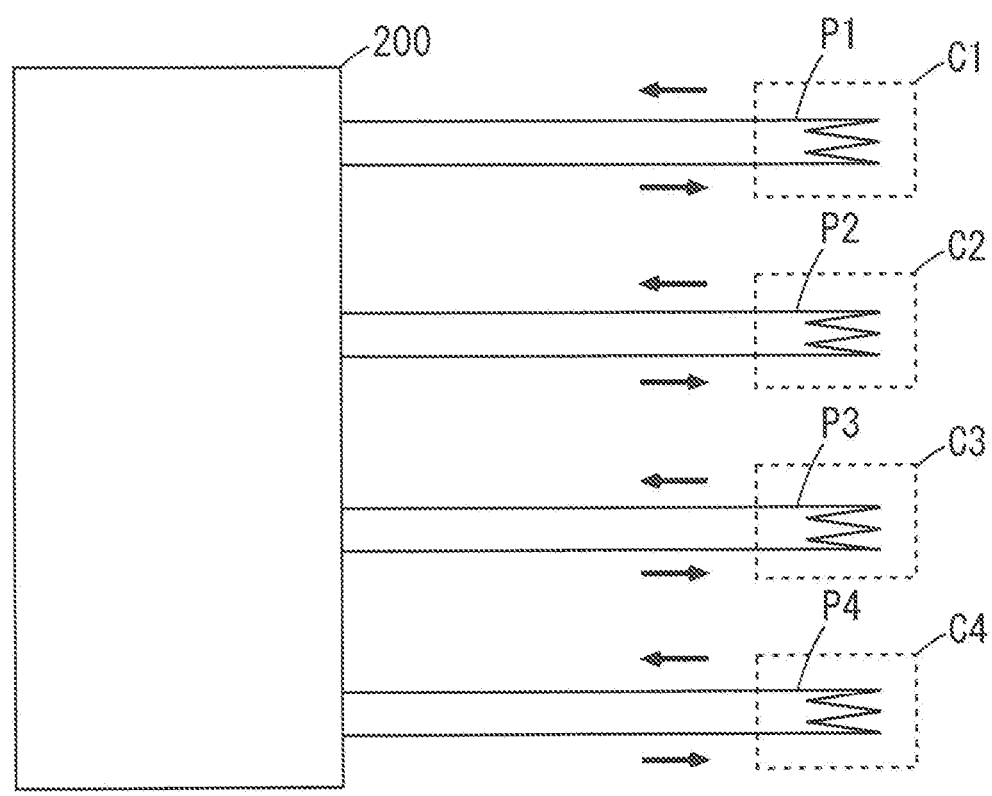
FIG. 2 is a schematic diagram showing a specific example of a configuration of a temperature regulator.

FIG. 2 is a schematic diagram showing a specific example of the temperature regulators C1, C2, C3, C4. The temperature regulators C1, C2, C3, C4 of FIG. 2 include temperature regulation pipes P1, P2, P3, P4, respectively. The temperature regulation pipes P1, P2, P3, P4 are provided to surround the outer peripheries of the supply pipes 21a, 31a, 35a, 41a of FIG. 1, respectively. One end and the other end of each of the temperature regulation pipes P1, P2, P3, P4 are connected to a temperature regulation device 200. The temperature regulation device 200 allows a temperature regulation liquid (pure water, for example), the temperature of which has been regulated, to circulate through the temperature regulation pipes P1, P2, P3, P4. Thus, the temperatures of the development liquid, the rinse liquid and the processing liquid in the supply pipes 21a, 31a, 35a, 41a of FIG. 1 are regulated at the temperature of the temperature regulating liquid. In the present example, the temperature of the temperature regulating liquid to be supplied to the temperature regulation pipes P2, P3, P4 is regulated in the target temperature range.

(3) Control System of Substrate Processing Apparatus

Figure 3:
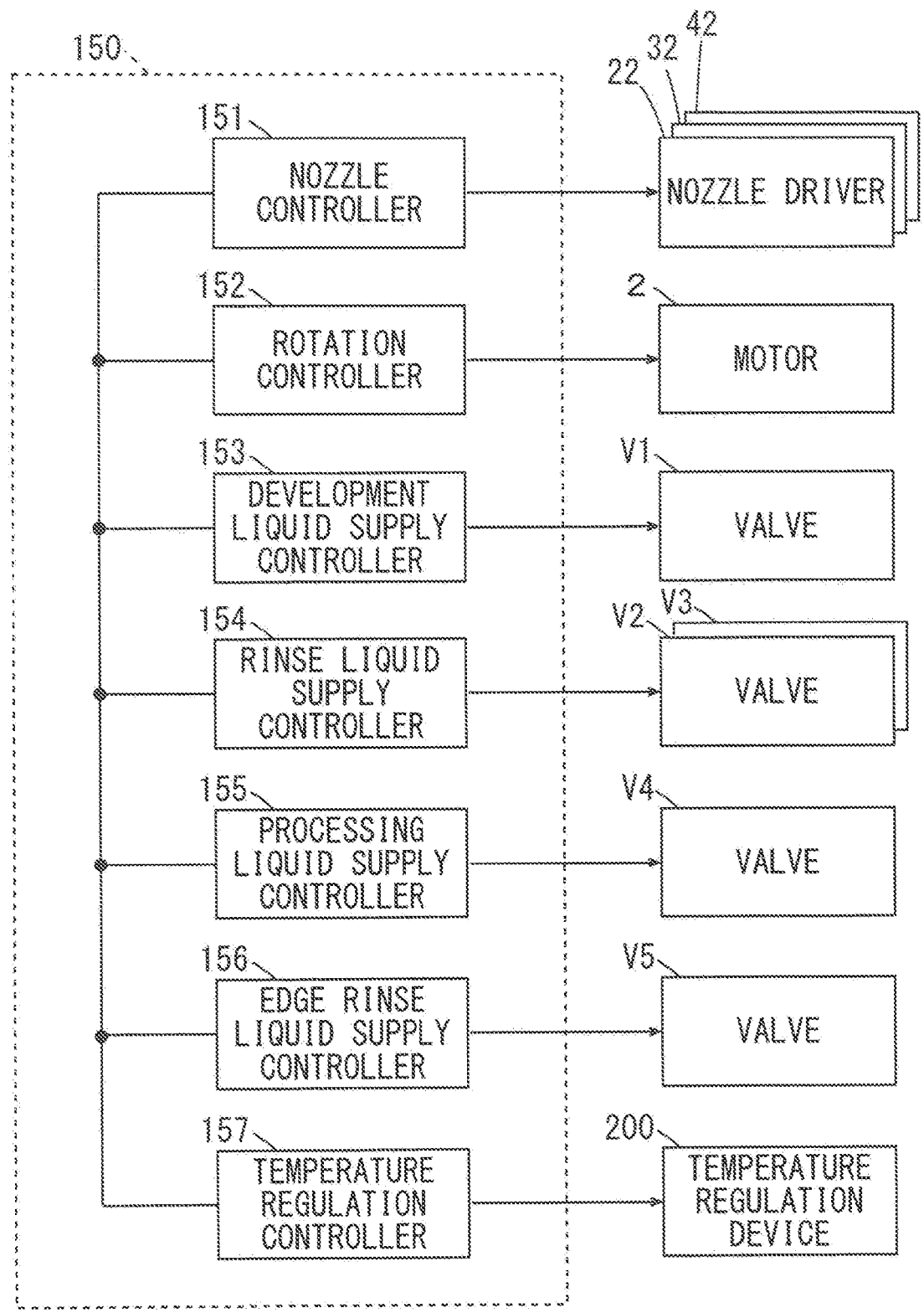
FIG. 3 is a block diagram showing a configuration of a control system of the substrate processing apparatus of FIG. 1.

FIG. 3 is a block diagram showing a configuration of a control system of the substrate processing apparatus 100 of FIG. 1. FIG. 3 shows a functional configuration of the controller 150. The controller 150 includes a nozzle controller 151, a rotation controller 152, a development liquid supply controller 153, a rinse liquid supply controller 154, a processing liquid supply controller 155, an edge rinse liquid supply controller 156 and a temperature regulation controller 157. The function of each element of the controller 150 of FIG. 3 is implemented when the CPU executes the control program.

The nozzle controller 151 controls the operations of the nozzle drivers 22, 32, 42. The nozzle drivers 22, 32, 42 move the development nozzle 21, the rinse nozzle 31 and the processing nozzle 41 of FIG. 1, respectively. Each of the development nozzle 21, the rinse nozzle 31 and the processing nozzle 41 of FIG. 1 is moved between a position over the substrate W and a position outside of the substrate W by the control of each of the nozzle drivers 22, 32, 42.

The rotation controller 152 controls the operation of the motor 2, thereby controlling the rotation of the substrate W held by the spin chuck 1 (FIG. 1). The development liquid supply controller 153 controls the opening and closing of the valve V1, thereby controlling the start and stop of discharge of the development liquid from the development nozzle 21 (FIG. 1). The rinse liquid supply controller 154 controls the opening and closing of the valve V2, thereby controlling the start and stop of discharge of the rinse liquid from the rinse nozzle 31 (FIG. 1). Further, the rinse liquid supply controller 154 controls the opening and closing of the valve V3, thereby controlling the start and stop of discharge of the rinse liquid from the back rinse nozzle 35 (FIG. 1).

The processing liquid supply controller 155 controls the opening and closing of the valve V4, thereby controlling the start and stop of discharge of the processing liquid from the processing nozzle 41 (FIG. 1). The edge rinse liquid supply controller 156 controls the opening and closing of the valve V5, thereby controlling the start and stop of discharge of the edge rinse liquid from the edge rinse nozzle 50 (FIG. 1). The temperature regulation controller 157 controls the temperature regulation device 200, thereby controlling regulation of the temperatures of the development liquid, the rinse liquid and the processing liquid by the temperature regulators C1 to C4 (FIG. 1).

(4) Processing of Substrates

Figure 4A:
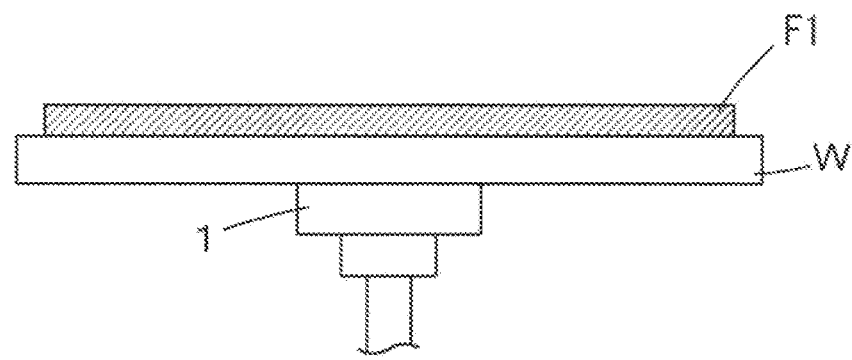
FIGS. 4A to 4C are schematic cross sectional views for explaining processing of a substrate in the substrate processing apparatus of FIG. 1.

FIGS. 4A to 6C are schematic cross sectional views for explaining the processing of the substrate W in the substrate processing apparatus 100 of FIG. 1. First, as shown in FIG. 4A, the substrate W is held in a horizontal attitude by the spin chuck 1. As described above, the resist film F1 is formed on one surface (an upper surface) of the substrate W, and the exposure pattern is formed on the resist film F1.

Figure 4B:
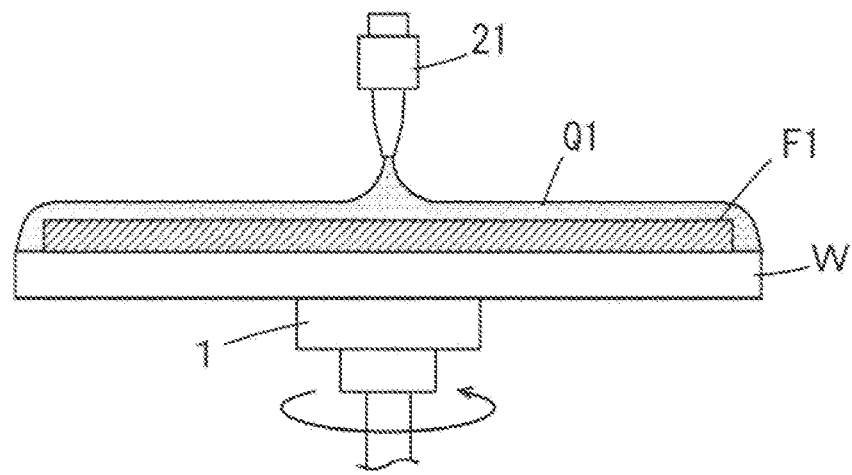

Subsequently, as shown in FIG. 4B, the development nozzle 21 is moved to the position over the center portion of the substrate W, and the development liquid Q1 is supplied to the one surface of the substrate W from the development nozzle 21 while the substrate W is rotated by the spin chuck 1. The development liquid Q1 spreads on the one surface of the substrate W due to a centrifugal force, whereby a liquid layer of the development liquid Q1 is formed on the one surface of the substrate W to cover the resist film F1. After the liquid layer is formed, the supply of the development liquid Q1 is stopped, and the development nozzle 21 is retracted from the position over the substrate W to the position outside of the substrate W.

Figure 4C:
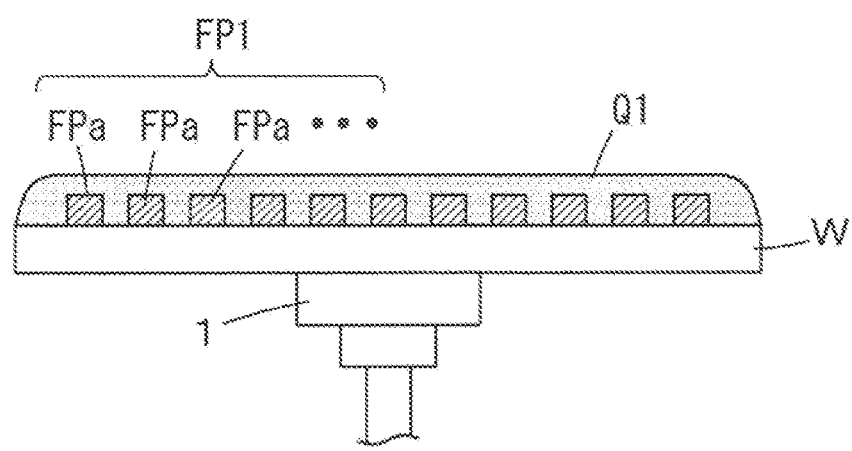

Subsequently, as shown in FIG. 4C, the substrate W is held in a stationary state or rotated at a low speed such that the liquid layer of the development liquid Q1 is kept on the one surface of the substrate W. In this state, the development processing of the resist film F1 proceeds. Specifically, the exposed regions or unexposed regions of the resist film gradually dissolve. Thus, a resist pattern FP1 including a plurality of convex portions FPa is formed on the one surface of the substrate W.

Figure 5A:
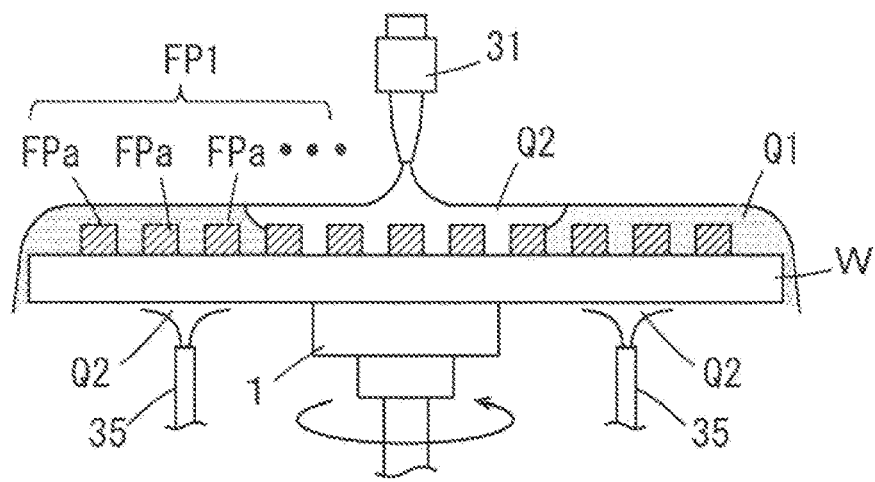
FIGS. 5A to 5C are schematic cross sectional views for explaining processing of the substrate in the substrate processing apparatus of FIG. 1.
Figure 5B:
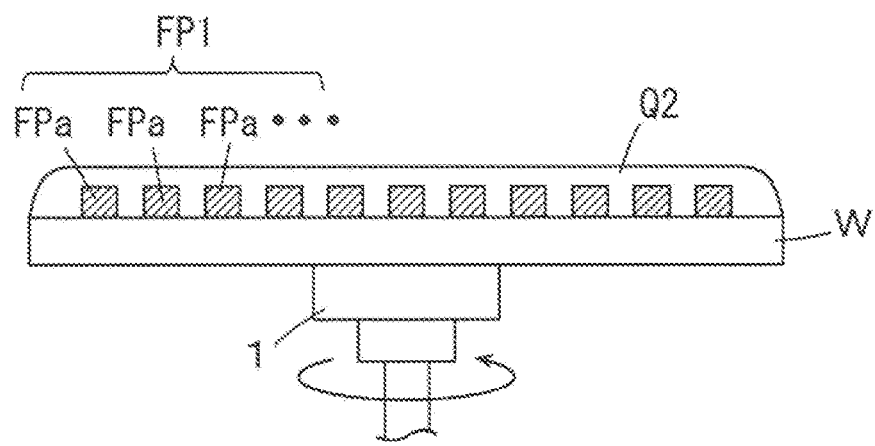

Subsequently, as shown in FIG. 5A, the rinse nozzle 31 is moved to the position over the center portion of the substrate W, and the rinse liquid Q2 is supplied to the one surface of the substrate W from the rinse nozzle 31 while the substrate W is rotated. Thus, development residues including the development liquid Q1, components of the dissolved resist film F1 and the like are washed away from the one surface of the substrate W. Further, the rinse liquid Q2 is supplied to the other surface (a lower surface) of the substrate W from the back rinse nozzle 35. Thus, the development residues that are washed away from the one surface of the substrate W are prevented from adhering to the other surface of the substrate W. The development liquid Q1 on the substrate W is replaced with the rinse liquid Q2, so that the liquid layer of the rinse liquid Q2 is formed to cover the one surface of the substrate W as shown in FIG. 5B. After the development liquid Q1 is replaced with the rinse liquid Q2, the supply of the rinse liquid Q2 is stopped, and the rinse nozzle 31 is retracted from the position over the substrate W to the position outside of the substrate W.

As described above, the temperature of the rinse liquid Q2 discharged from the rinse nozzle 31 is regulated in the target temperature range by the temperature regulator C2 (FIG. 1). Therefore, the one surface of the substrate W is covered with the rinse liquid Q2 discharged from the rinse nozzle 31, whereby the temperature of the substrate W is regulated in the target temperature range from the one surface of the substrate W. Further, in the present example, the temperature of the rinse liquid Q2 to be supplied to the other surface of the substrate W from the back rinse nozzle 35 is also regulated in the target temperature range by the temperature regulator C3 (FIG. 1). Therefore, the temperature of the substrate W is also regulated in the target temperature range from the other surface of the substrate W.

In order to stabilize the temperature of the substrate W in the target temperature range, the rinse liquid Q2 may also be continuously supplied to the substrate W from the rinse nozzle 31 and the back rinse nozzle 35 for a certain period of time after the development residues are sufficiently washed away. Further, the rinse nozzle 31 may supply the rinse liquid Q2 to the one surface of the substrate W while moving between the position over the center portion of the substrate W and a position over the peripheral portion of the substrate W. Alternatively, a slit nozzle having a slit-like discharge port may be used instead of the rinse nozzle 31 in order to uniformly supply the rinse liquid Q2 to a wide area of the substrate W.

Figure 5C:
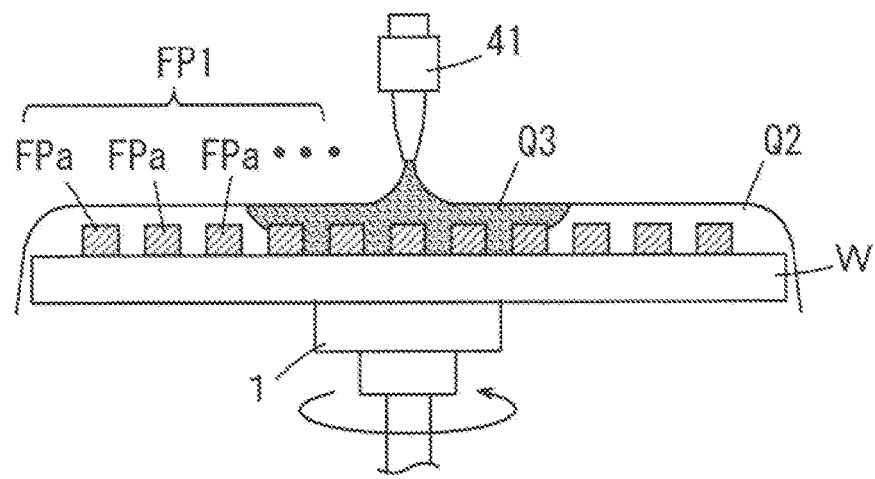

Next, as shown in FIG. 5C, the processing nozzle 41 is moved to the position over the center portion of the substrate W, and a processing liquid Q3 is supplied to the one surface of the substrate W from the processing nozzle 41 while the substrate W is rotated. The processing liquid Q3 spreads on the one surface of the substrate W by a centrifugal force, and the rinse liquid Q2 on the substrate W is replaced with the processing liquid Q3. After the rinse liquid Q2 is replaced with the processing liquid Q3, the supply of the processing liquid Q3 is stopped, and the processing nozzle 41 is retracted from the position over the substrate W to a position outside of the substrate W. Before the processing liquid Q3 is supplied to the substrate W, the rotation speed of the substrate W may be regulated (300 to 2000 rpm, for example) such that the thickness of the liquid layer of the rinse liquid Q2 is reduced. In this case, the efficiency of replacement of the rinse liquid Q2 with the processing liquid Q3 is enhanced.

Figure 6A:
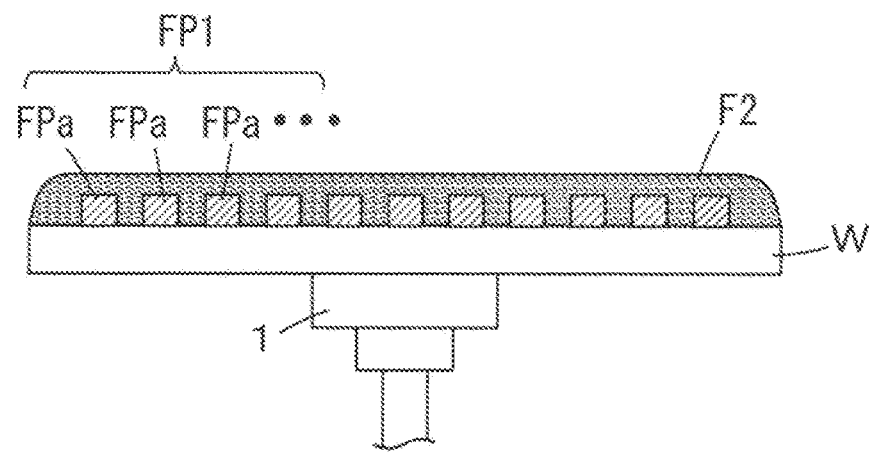
FIGS. 6A to 6C are schematic cross sectional views for explaining the processing of the substrate in the substrate processing apparatus of FIG. 1.

Thereafter, the processing liquid Q3 dries on the substrate W, thereby solidifying. Thus, as shown in FIG. 6A, a reversal film F2 made of a reversal material is formed on the one surface of the substrate W to cover the resist pattern FP1.

As described above, the temperature of the processing liquid Q3 to be discharged from the processing nozzle 41 is regulated in the target temperature range by the temperature regulator C4. In this case, because the temperature of the substrate W is regulated in the target temperature range by the rinse liquid Q2, even when the processing liquid Q3 is supplied to the substrate W from the processing nozzle 41, the temperature of the substrate W hardly changes and is kept in the target temperature range. Further, the temperature of the processing liquid Q3 supplied to the substrate W is kept in the target temperature range.

Figure 6B:
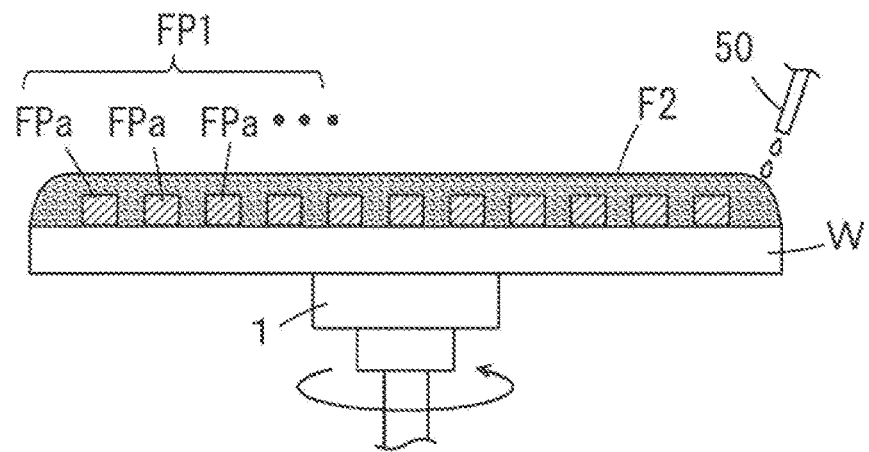
Figure 6C:
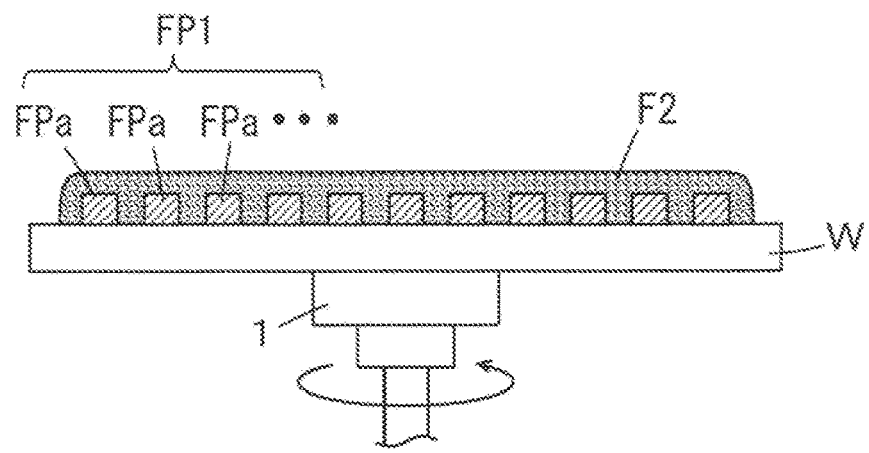

Subsequently, as shown in FIG. 6B, the edge rinse liquid is supplied to the peripheral portion of the one surface of the substrate W from the edge rinse nozzle 50 while the substrate W is rotated. Thus, as shown in FIG. 6C, the peripheral portion of the reversal film F2 on the substrate W is removed. When the processing liquid Q3 is drying, the edge rinse liquid may be supplied from the edge rinse nozzle 50.

In the case where the reversal film F2 exists on the outer periphery of the substrate W, when the outer periphery of the substrate W is held, the existing portion of the reversal film F2 may be stripped from the substrate W and become particles. In the present example, the reversal film F2 is removed from the outer periphery of the substrate W by the edge rinse liquid. Thus, when the substrate W is transported, the existing portion of the reversal film F2 is prevented from becoming particles. Further, edge rinse nozzles for discharging the edge rinse liquid to the peripheral portion or the outer periphery of the other surface of the substrate W may be provided separately.

Figure 7A:
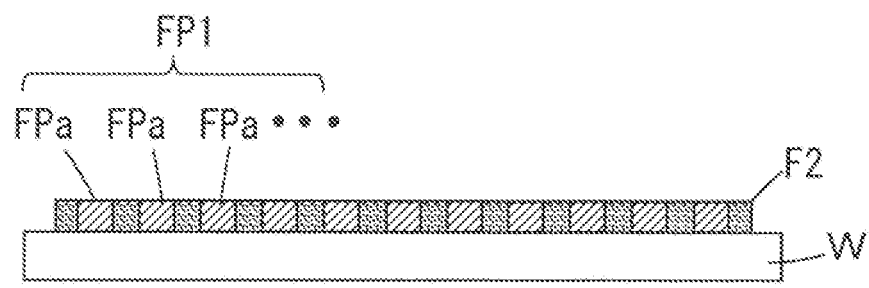
FIGS. 7A and 7B are schematic cross sectional views for explaining the processing of the substrate after a reversal film is formed.
Figure 7B:
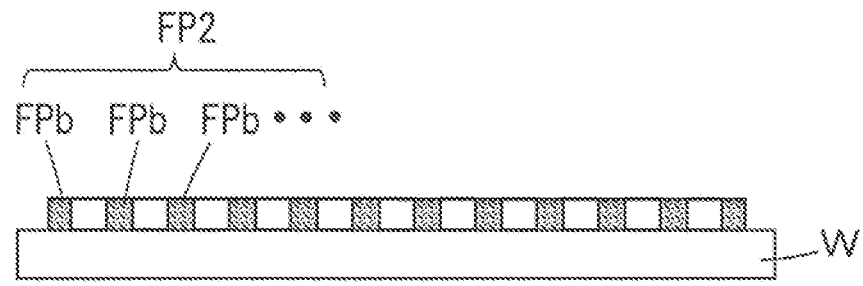

Thus, a series of processing in the substrate processing apparatus 100 ends, and the substrate W is carried out from the substrate processing apparatus 100. Subsequently, the processing to be performed on the substrate W after the substrate W is carried out from the substrate processing apparatus 100 will be described. FIGS. 7A and 7B are schematic cross sectional views for explaining the subsequent processing.

As shown in FIG. 7A, the reversal film F2 is etched (etchback) such that the upper surface of each convex portion FPa of the resist pattern FP1 is exposed. Subsequently, as shown in FIG. 7B, each convex portion FPa of the resist pattern FP1 is removed by etching. Thus, a reversal pattern FP2 having a plurality of convex portions FPb is formed on the one surface of the substrate W. In this case, positions of grooves between the plurality of convex portions FPb of the reversal pattern FP2 corresponds to positions of the plurality of convex portions FPa of the resist pattern FP1. Thereafter, the substrate W is etched with the reversal pattern FP2 as a mask.

The effect of formation of the reversal pattern FP2 will be described. When the reversal pattern FP2 is not formed and the resist pattern FP1 is used as a mask, the rinse liquid Q2 on the substrate W is removed from the substrate W by spin-dry or the like after the development processing is performed on the resist film F1. In that case, collapse of the convex portions FPa of the resist pattern FP1 (pattern collapse) may occur due to surface tension of the rinse liquid Q2. Further, the resist pattern FP1 may be deformed during the etching processing of the substrate W. In particular, when the resist pattern FP1 is fine (when the size of each convex portion FPa is small), the pattern is likely to be deformed due to such pattern collapse and etching.

In contrast, when the reversal pattern FP2 is formed, the rinse liquid Q2 on the substrate W is not removed by spin-dry or the like but is replaced with the processing liquid Q3. Therefore, the pattern collapse caused by the surface tension of the rinse liquid Q2 is unlikely to occur. Further, the reversal pattern FP2 has etch resistance higher than that of the resist pattern FP1, so that the reversal pattern FP2 is unlikely to be deformed during the etching processing of the substrate W. Therefore, also when the reversal pattern FP2 is fine, deformation of the pattern caused by pattern collapse and etching is prevented.

However, part of the formed reversal pattern FP2 may not correspond to the resist pattern FP1, and the desired reversal pattern FP2 may not be obtained appropriately. As a result of much experimentation and study, the inventors of the present invention have discovered that the following phenomenon occurs due to non-uniformity of the thickness of the reversal film F2 formed on the one surface of the substrate W.

Figure 8A:
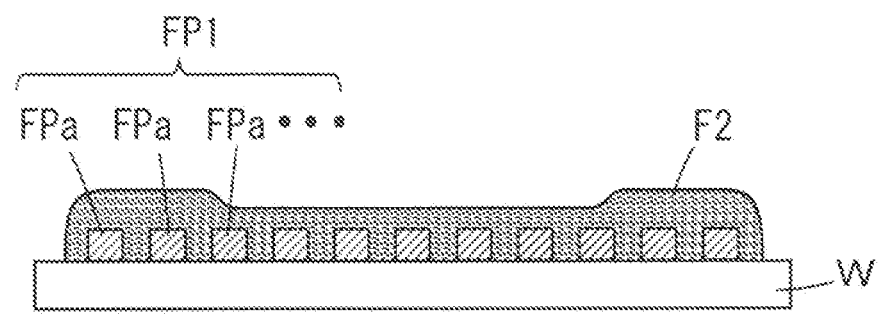
FIGS. 8A and 8B are diagrams for explaining a phenomenon that occurs when a film thickness of the reversal film is non-uniform.
Figure 8B:
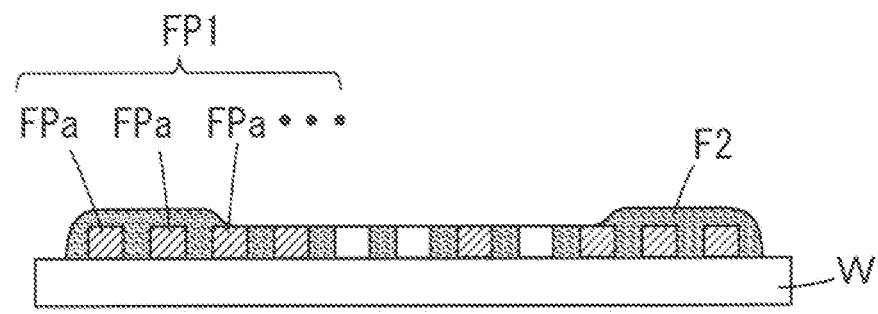

FIGS. 8A and 8B are diagrams for explaining the phenomenon that occurs when the film thickness of the reversal film F2 is non-uniform. In the example of FIG. 8A, the thickness of the portion of the reversal film F2 formed on the peripheral portion of the substrate W is larger than the thickness of the portion of the reversal film F2 formed on the center portion of the substrate W. In this case, in the processing of FIG. 7A (etching of the reversal film F2), the upper surfaces of parts of the convex portions FPa of the resist pattern FP1 are not exposed on the peripheral portion of the substrate W as shown in FIG. 8B. On the other hand, parts of the convex portions FPa of the resist pattern FP1 on the center portion of the substrate W are removed. As described above, the upper surface of each convex portion FPa of the resist pattern FP1 cannot be exposed appropriately. Therefore, in the processing of FIG. 7B, the reversal pattern FP2 cannot be formed appropriately.

As such, in the present embodiment, the temperatures of the rinse liquid Q2 and the processing liquid Q3 to be supplied to the substrate W are regulated in the target temperature range. In this case, the processing liquid Q3, the temperature of which has been regulated in the same target temperature range, is supplied to the substrate W with the temperature of the entire substrate W kept in the target temperature range by the rinse liquid Q2. Thus, the temperatures of the substrate W and the processing liquid Q3 hardly change, and the processing liquid Q3 spreads on the one surface of the substrate W. Therefore, variations in temperature of the processing liquid Q3 on the one surface of the substrate W is reduced. As a result, the film thickness of the reversal film F2 can be uniform.

(5) Effects

As described above, in the substrate processing apparatus 100 according to the present embodiment, the temperature of the substrate W is regulated in the target temperature range when the reversal film F2 is formed, so that the film thickness of the reversal film F2 can be uniform. Thus, the resist pattern FP1 can be exposed appropriately in the subsequent processing, and the resist pattern FP1 can be removed appropriately. Therefore, the reversal pattern FP2 having grooves corresponding to the resist pattern FP1 can be formed appropriately. As a result, the desired reversal pattern FP2 can be formed appropriately on the substrate W.

Further, in the present embodiment, after the development processing is performed on the resist film F1, the rinse liquid, the temperature of which has been regulated in the target temperature range by the temperature regulators C2, C3, is supplied from the rinse nozzle 31 and the back rinse nozzle 35 to the one surface and the other surface of the substrate W. Thus, the temperature of the substrate W can be regulated in the target temperature range while development residues are washed away from the substrate W by the rinse liquid.

Further, in the present embodiment, with the rinse liquid remaining on the one surface of the substrate W, the processing liquid, the temperature of which has been regulated in the target temperature range by the temperature regulator C4, is supplied to the one surface of the substrate W from the processing nozzle 41. In this case, the processing liquid is supplied when the one surface of the substrate W is wet with the rinse liquid, whereby the processing liquid easily spreads on the one surface of the substrate W. Thus, the amount of the processing liquid to be used can be reduced. Further, with the temperature of the substrate W kept in the target temperature range by the rinse liquid, the processing liquid having the temperature in the same range is supplied to the substrate W. Therefore, variations in temperature of the processing liquid on the substrate W is reduced.

Figure 9:
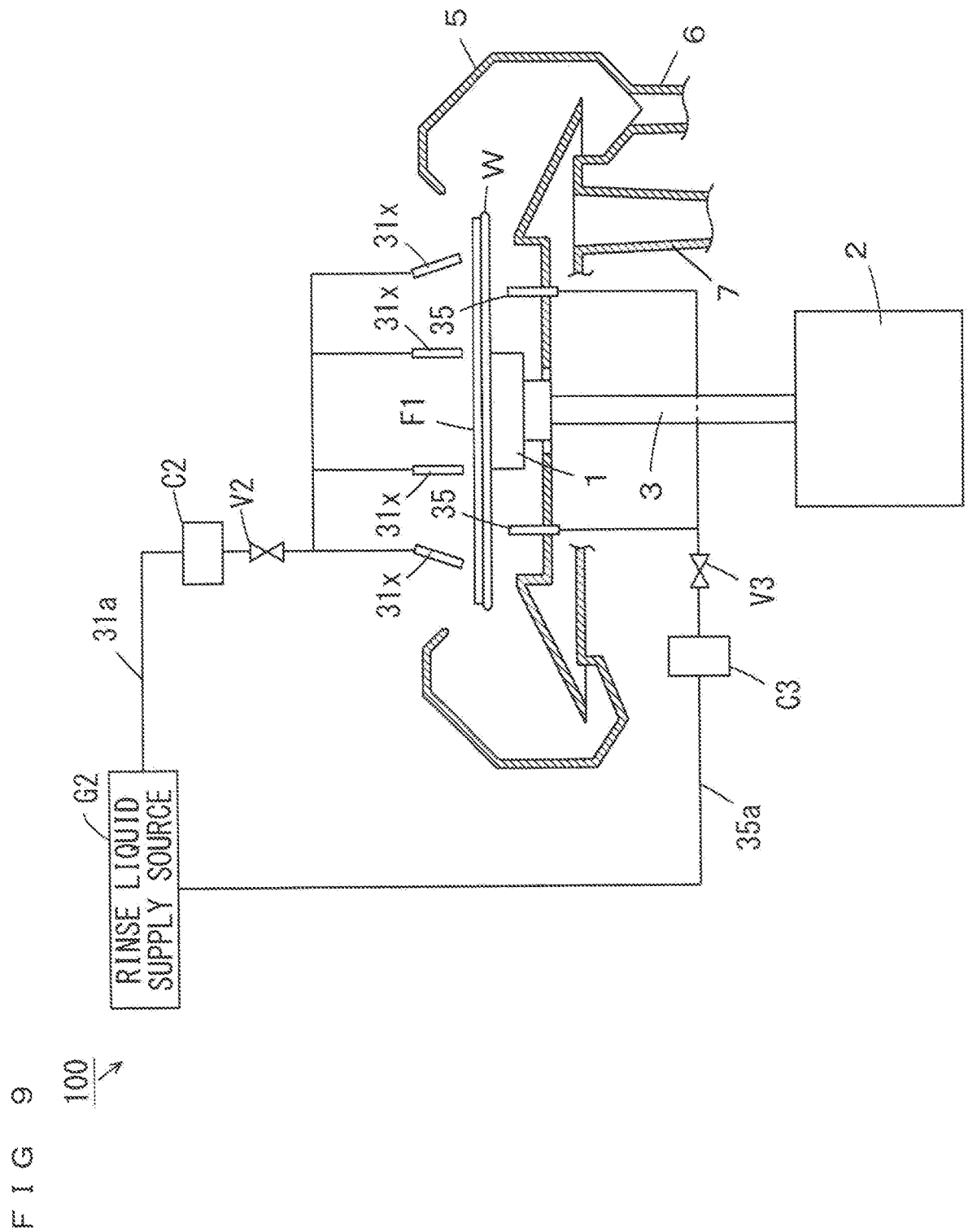
FIG. 9 is a schematic cross sectional view showing an example of a configuration of a substrate processing apparatus.

(6) Other Embodiments (6-1) Another Example of Configuration of Substrate Processing Apparatus FIG. 9 is a schematic cross sectional view showing another example of the configuration of a substrate processing apparatus 100. As for the substrate processing apparatus 100 of FIG. 9, differences from the substrate processing apparatus 100 of FIG. 1 will be described. In FIG. 9, the development liquid supplier 20, the processing liquid supplier 40, the edge rinse nozzle 50 and the controller 150 of FIG. 1 are not shown.

In the substrate processing apparatus 100 of FIG. 9, a rinse liquid supplier 30 includes a plurality of rinse nozzles 31x instead of the rinse nozzle 31. Each rinse nozzle 31x is connected to a supply pipe 31a and directed to one surface (an upper surface) of the substrate W held by the spin chuck 1. When a valve V2 is opened, a rinse liquid is supplied to each rinse nozzle 31x through a supply pipe 31a from a rinse liquid supply source G2, and the rinse liquid is discharged to one surface of the substrate W from each rinse nozzle 31x. The temperature of the rinse liquid to be supplied to each rinse nozzle 31x is regulated in a target temperature range by a temperature regulator C2.

In the present example, since the plurality of rinse nozzles 31x are used, the rinse liquid, the temperature of which has been regulated in the target temperature range, can be supplied to the one surface of the substrate W uniformly and efficiently. Thus, variations in temperature of the substrate W can be effectively reduced, and the film thickness of a reversal film F2 can be uniform.

(6-2) Another Example of Processing

Figure 10A:
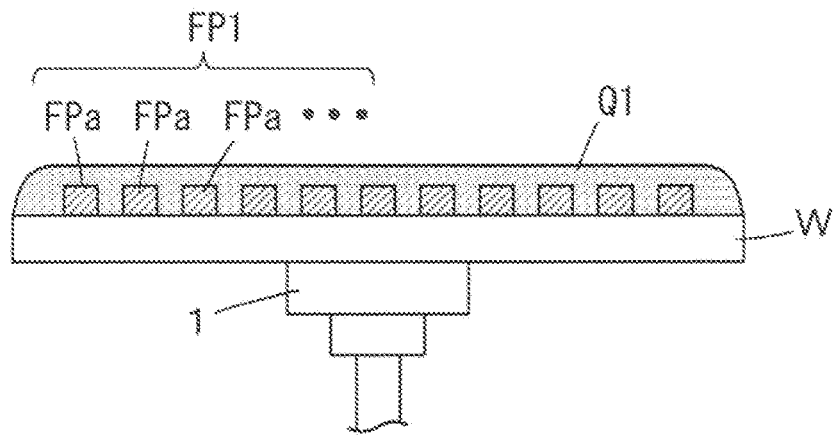
FIGS. 10A to 10C are schematic cross sectional views for explaining another example of processing of a substrate in the substrate processing apparatus.
Figure 10B:
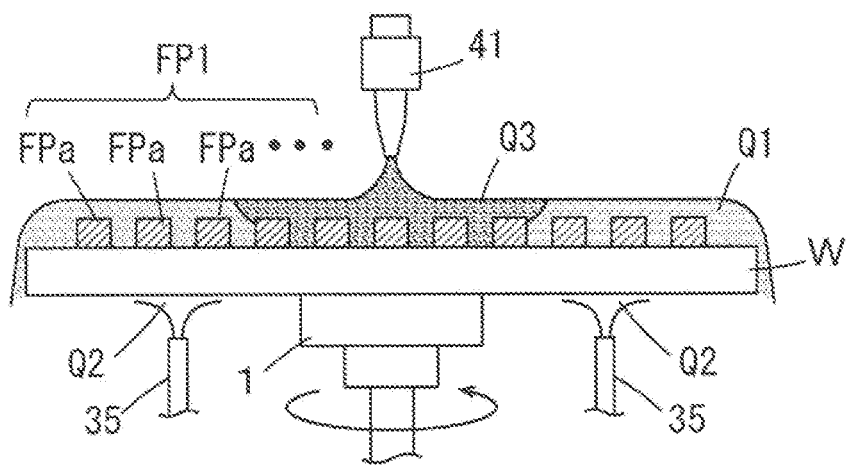
Figure 10C:
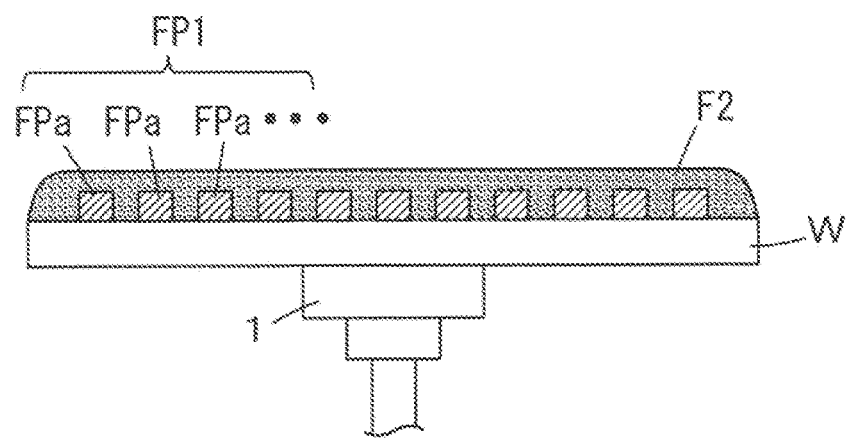

FIGS. 10A to 10C are schematic cross sectional views for explaining another example of processing of the substrate W in the substrate processing apparatus 100. As for the processing of FIGS. 10A to 10C, differences from the example of FIGS. 4 to 6 will be explained.

As shown in FIG. 10A, the development processing of a resist film F1 proceeds with the liquid layer of a development liquid Q1 kept on one surface of the substrate W, and a resist pattern FP1 is formed on the one surface of the substrate W. In the present example, an organic solvent is used as a development liquid. The method of forming the liquid layer of the development liquid Q1 is similar to the example of FIGS. 4A and 4B.

Subsequently, as shown in FIG. 10B, a processing nozzle 41 is moved to a position over the center portion of the substrate W, and a processing liquid Q3 is supplied onto the one surface of the substrate W from the processing nozzle 41 while the substrate W is rotated. The temperature of the processing liquid Q3 is regulated in a target temperature range by a temperature regulator C4. A rinse liquid may be supplied to the other surface of the substrate W from the back rinse nozzle 35 (FIG. 1 or 9) in the period during which the processing liquid Q3 is supplied to the one surface of the substrate W.

The processing liquid Q3 spreads on the one surface of the substrate W by a centrifugal force, the development processing is stopped, and then the development liquid Q1 on the substrate W is replaced with the processing liquid Q3. Before the processing liquid Q3 is supplied to the substrate W, the rotation speed of the substrate W may be regulated such that the thickness of the liquid layer of the development liquid Q1 is reduced (300 to 2000 rpm, for example). In this case, the efficiency of replacement of the development liquid Q1 with the processing liquid Q3 is enhanced.

When the processing liquid Q3 dries on the substrate W, a reversal film F2 is formed on the one surface of the substrate W to cover the resist pattern FP1 as shown in FIG. 10C. Thereafter, similarly to the example of FIGS. 6B and 6C, the peripheral portion of the reversal film F2 is removed, and a series of processing ends.

In this manner, in the example of FIGS. 10A to 10C, with the development liquid Q1 remaining on the one surface of the substrate W, the processing liquid Q3, the temperature of which has been regulated in the target temperature range, is supplied to the one surface of the substrate W after the development processing is performed on the resist film F1. In this case, the temperature of the substrate W is regulated in the target temperature range by the processing liquid Q3. Thus, variations in temperature of the substrate W and variations in temperature of the processing liquid Q3 on the substrate W are reduced. Therefore, the reversal film F2 having a uniform thickness can be formed on the substrate W. Therefore, the desired reversal pattern FP2 can be formed appropriately on the substrate W.

Further, since the processing liquid Q3 is supplied with the one surface of the substrate W wet with the development liquid Q1, the processing liquid Q3 spreads easily on the one surface of the substrate W. Thus, the amount of the processing liquid Q3 to be used can be reduced. Further, in the present example, the rinse liquid is not supplied to the one surface of the substrate W. Therefore, the amount of the rinse liquid to be used is reduced, and the time length during which the substrate W is processed is shortened. Further, it is not necessary to provide the rinse nozzle 31 and the temperature regulator C2. Thus, the cost can be lowered, and the size of the substrate processing apparatus 100 can be reduced.

(6-3) Other Examples

The temperature regulator C1 may regulate the temperature of the development liquid in the target temperature range. In this case, the development liquid also contributes to regulating the temperature of the substrate W. Therefore, the temperature of the substrate W can be regulated more accurately, and the thickness of the reversal film F can be more uniform.

Further, a temperature regulator that regulates the temperature of the spin chuck 1 in the target temperature range may be provided. In this case, the temperature of the substrate W can be more uniformly and efficiently regulated from the other surface of the substrate W. Specifically, the temperature of the center portion of the other surface of the substrate W can be regulated by the spin chuck 1, and the temperature of its surrounding portion can be regulated by the rinse liquid supplied from the back rinse nozzle 35.

(7) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate processing apparatus 100 is an example of a substrate processing apparatus, the development liquid supplier 20 is an example of a development processor, the rinse liquid supplier 30 and the processing liquid supplier 40 are an example of a reversal film former, the temperature regulators C2, C3 are an example of a rinse liquid temperature regulator, the rinse liquid supplier 30 is an example of a rinse liquid supplier, the processing liquid supplier 40 is an example of a processing liquid supplier, the rinse nozzle 31 is an example of a first rinse nozzle, the spin chuck 1 is an example of a rotation holder, the back rinse nozzle 35 is an example of a second rinse nozzle, and the temperature regulator C4 is an example of a processing liquid temperature regulator.

As each of constituent elements recited in the claims, various other elements having configurations or functions described in the claims can be also used.

INDUSTRIAL APPLICABILITY

The present invention can be utilized for processing for various substrates.

The invention claimed is:

1. A substrate processing method of processing a substrate having a resist film made of a photosensitive material on one surface, including:
    forming a resist pattern on the one surface of the substrate by performing development processing on the resist film by a development process; and
    forming a reversal film having etch resistance higher than that of the resist film on the one surface of the substrate by a reversal film former to cover the resist pattern while regulating a temperature of the substrate in a certain range after the development processing is performed by the development processor, wherein the forming a reversal film includes,
    regulating a temperature of a rinse liquid in the certain range,
    regulating a temperature of a processing liquid made of a material of the reversal film in the certain range,
    after the development processing, supplying the rinse liquid, the temperature of which has been regulated, to the one surface of the substrate to replace a development liquid with the rinse liquid and also to form a liquid layer of the rinse liquid on the resist pattern, and
    supplying the processing liquid, the temperature of which has been regulated, to the one surface of the substrate with the liquid layer of the rinse liquid kept on the resist pattern, to replace the liquid layer of the rinse liquid with the processing liquid and also to form a liquid layer of the processing liquid on the resist pattern.

2. The substrate processing method according to claim 1, further including:
    forming the reversal film by drying the liquid layer of the processing liquid;
    etching the reversal film by a certain thickness to expose an upper surface of the resist pattern; and
    forming the etched reversal film as a reversal pattern by removing the resist pattern by etching.

3. The substrate processing method according to claim 1, wherein
    performing the development processing includes performing the development processing by forming a liquid layer of the development liquid on the resist film, and
    the forming a liquid layer of the rinse liquid includes, after forming the liquid layer of the development liquid, supplying the rinse liquid, the temperature of which has been regulated, to the one surface of the substrate to replace the liquid layer of the development liquid with the rinse liquid and also to form the liquid layer of the rinse liquid on the resist pattern.

4. The substrate processing method according to claim 1, wherein the forming a reversal film further includes, after forming the liquid layer of the development liquid, supplying the rinse liquid, the temperature of which has been regulated, to another surface opposite to the one surface of the substrate.

5. The substrate processing method according to claim 1, wherein the supplying the processing liquid to the one surface of the substrate includes supplying the processing liquid to the one surface of the substrate with the liquid layer of the rinse liquid kept on the resist pattern and with the substrate rotated by a rotation holder.

6. The substrate processing method according to claim 5, wherein the forming a reversal film further includes, before the processing liquid is supplied to the one surface of the substrate, regulating a rotation speed of the substrate rotated by the rotation holder such that a thickness of the liquid layer of the rinse liquid on the one surface of the substrate is reduced.

7. A substrate processing method of processing a substrate having a resist film made of a photosensitive material on one surface, including:
    forming a resist pattern on the one surface of the substrate by performing development processing on the resist film using a development liquid; and
    forming a reversal film having etch resistance higher than that of the resist film on the one surface of the substrate to cover the resist pattern while regulating a temperature of the substrate in a certain range after the development processing,
    wherein the forming a reversal film includes
    regulating a temperature of a processing liquid made of a material of the reversal film in the certain range, and
    after the development processing, supplying the processing liquid, the temperature of which has been regulated, to the one surface of the substrate to replace the development liquid with the processing liquid and also to form a liquid layer of the processing liquid on the resist pattern.

* * * * *